(12) United States Patent
Chida

(10) Patent No.: US 7,883,939 B2
(45) Date of Patent: Feb. 8, 2011

(54) METHOD FOR MANUFACTURING SEMICONDUCTOR DEVICE

(75) Inventor: Akihiro Chida, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/613,552

(22) Filed: Nov. 6, 2009

(65) Prior Publication Data

US 2010/0120200 A1    May 13, 2010

(30) Foreign Application Priority Data

Nov. 11, 2008    (JP) .............................. 2008-288760

(51) Int. Cl.
 *H01L 21/60* (2006.01)
(52) U.S. Cl. ........................ 438/109; 438/700; 438/637; 438/795; 438/459; 438/463; 257/E21.517
(58) Field of Classification Search ........... 438/10–127, 438/33, 58, 455–465, 795–799, 700, 637
See application file for complete search history.

(56) References Cited

U.S. PATENT DOCUMENTS

| | | | |
|---|---|---|---|
| 5,075,166 A | 12/1991 | Sikorski et al. | |
| 5,597,631 A | 1/1997 | Furumoto et al. | |
| 5,640,761 A | 6/1997 | DiStefano et al. | |
| 5,770,313 A | 6/1998 | Furumoto et al. | |
| 6,103,977 A | 8/2000 | Namgung et al. | |
| 6,188,028 B1 | 2/2001 | Haba et al. | |
| 6,224,965 B1 | 5/2001 | Haas et al. | |
| 6,403,221 B1 | 6/2002 | Nakamura et al. | |
| 6,530,147 B1 | 3/2003 | Haas et al. | |
| 6,734,568 B2 * | 5/2004 | Matsuo et al. | .............. 257/781 |
| 6,805,958 B2 | 10/2004 | Nakamura et al. | |

(Continued)

FOREIGN PATENT DOCUMENTS

EP    1092739 A    4/2001

(Continued)

OTHER PUBLICATIONS

Specification of U.S. Appl. No. 12/498,462, filed Jul. 7, 2009.

*Primary Examiner*—Savitri Mulpuri
(74) *Attorney, Agent, or Firm*—Eric J. Robinson; Robinson Intellectual Property Law Office, P.C.

(57) ABSTRACT

A method for manufacturing a thin but robust stack of electrically connected thin film semiconductor elements includes the steps of forming a first element to be stacked: forming a separation layer and a semiconductor element layer over a substrate, forming a wiring connected to the semiconductor element layer, forming a protective material over the semiconductor layer and the wiring, forming a conductive region electrically connected to the wiring in the protective layer, and separating the semiconductor element layer from the substrate along the separation layer. A second element is formed according to the aforementioned process, and the first element is stacked thereon, before separating the second element from its substrate. The first element is bonded to the protective layer of the second element so that the semiconductor element layers of the first and the second element are electrically connected to each other through the protective layer, without damaging the protective layer.

21 Claims, 11 Drawing Sheets

U.S. PATENT DOCUMENTS

| | | | |
|---|---|---|---|
| 7,049,178 B2 | 5/2006 | Kim et al. | |
| 7,061,083 B1 | 6/2006 | Usami et al. | |
| 7,202,419 B2 | 4/2007 | Cooper et al. | |
| 7,245,013 B2 | 7/2007 | Reiss et al. | |
| 7,279,412 B2 | 10/2007 | Mok et al. | |
| 7,485,489 B2 | 2/2009 | Bjorbell | |
| 2004/0016118 A1 | 1/2004 | Haas et al. | |
| 2005/0181601 A1* | 8/2005 | Tomoda et al. | 438/662 |
| 2005/0233122 A1 | 10/2005 | Nishimura et al. | |
| 2006/0105153 A1 | 5/2006 | Jang et al. | |
| 2006/0281235 A1* | 12/2006 | Tayanaka | 438/151 |
| 2007/0020932 A1 | 1/2007 | Maruyama et al. | |
| 2007/0039753 A1 | 2/2007 | Kim et al. | |
| 2007/0246254 A1 | 10/2007 | Kumar et al. | |
| 2007/0278563 A1 | 12/2007 | Takano et al. | |
| 2008/0012126 A1 | 1/2008 | Dozen et al. | |
| 2008/0083954 A1 | 4/2008 | Tokunaga | |
| 2008/0182349 A1* | 7/2008 | Yamazaki et al. | 438/29 |
| 2008/0224940 A1 | 9/2008 | Sugiyama et al. | |
| 2008/0224941 A1 | 9/2008 | Sugiyama et al. | |
| 2008/0242005 A1 | 10/2008 | Dozen et al. | |
| 2008/0311706 A1 | 12/2008 | Dozen et al. | |
| 2009/0302455 A1* | 12/2009 | Chida et al. | 257/698 |
| 2009/0302457 A1* | 12/2009 | Chida et al. | 257/702 |
| 2009/0314527 A1* | 12/2009 | Hatano et al. | 174/255 |
| 2010/0045919 A1* | 2/2010 | Chida et al. | 349/149 |
| 2010/0171221 A1* | 7/2010 | Chida | 257/769 |

FOREIGN PATENT DOCUMENTS

| | | |
|---|---|---|
| EP | 1589797 A | 10/2005 |
| JP | 05-190582 A | 7/1993 |
| JP | 07-007246 A | 1/1995 |
| JP | 10-092980 A | 4/1998 |
| JP | 2002-198658 A | 7/2002 |
| JP | 2004-078991 A | 3/2004 |
| JP | 2004-362341 A | 12/2004 |
| JP | 2007-091822 A | 4/2007 |
| JP | 2008-112988 A | 5/2008 |
| WO | WO-96/09158 | 3/1996 |
| WO | WO-01/01740 A | 1/2001 |
| WO | WO-2004/001848 A | 12/2003 |
| WO | WO-2008/041716 A | 4/2008 |

* cited by examiner

METHOD FOR MANUFACTURING SEMICONDUCTOR DEVICE

BACKGROUND OF THE INVENTION

1. Field of the Invention

The invention disclosed in this specification relates to a semiconductor device and a method for manufacturing the same.

2. Description of the Related Art

Advances in semiconductor manufacturing technologies have allowed large-scale integrated circuits to be more highly integrated, and demand for LSI systems (LSI: Large Scale Integration), in which a plurality of functions is integrated on a silicon chip, has increased. In recent years, three-dimensional LSI systems consisting in a stack of a plurality of LSI chips have been developed to be ready for sophisticated and complicated systems. The 3D LSI systems are also referred to as multi-chip packages because a package includes a plurality of LSIs.

Another technology has also been developed: a semiconductor element layer separated from a semiconductor substrate is transferred on another substrate by a transfer method; and a semiconductor element layer separated from still another substrate is transferred thereon. According to this technology, a semiconductor integrated circuit can be more highly integrated while being reduced in thickness as compared with a circuit integrated on a silicon chip (see Patent Document 1).

[Reference]
Japanese Patent Laid-Open No. 2004-200522

SUMMARY OF THE INVENTION

As described above, when a semiconductor integrated circuit is manufactured by transferring a semiconductor element layer separated from a semiconductor substrate, the size and thickness of the semiconductor integrated circuit can be reduced without increasing the area thereof.

However, a semiconductor integrated circuit that is reduced in size and thickness has a disadvantage of low resistance to external stress.

As a material for protecting such a semiconductor integrated circuit, a prepreg is known which uses an organic resin and a sheet-like fiber body such as glass cloth. The prepreg is a strong protective material, which can prevent damage of a semiconductor element layer in a semiconductor integrated circuit that is reduced in thickness.

When more semiconductor integrated circuits are stacked, however, it is necessary to manufacture a wiring for electrically connecting a plurality of semiconductor integrated circuits. In order to achieve this, a through-hole penetrating through a prepreg that is a protective material has to be made so that a wiring is formed in the through-hole.

The formation of the through-hole in the prepreg causes damage to a fiber body, which might reduce the strength of the prepreg.

It is also necessary to form another wiring (in this specification, referred to as a connecting wiring) for electrically connecting a semiconductor integrated circuit to a wiring (in this specification, referred to as a through-wiring) that electrically connects semiconductor integrated circuits through a through-hole in a prepreg.

The position of a connecting wiring is often determined in a manufacturing process of a semiconductor integrated circuit. Therefore, the position of a through-hole and a through-wiring in a prepreg is inevitably determined, which might make a correct alignment difficult.

Misalignment between a connecting wiring and a through-wiring might cause connection failure and malfunction of a semiconductor device.

Thus, an object of the invention disclosed below is to easily determine the position of a connecting wiring and a through-wiring for electrically connecting a plurality of semiconductor integrated circuits stacked with a protective material interposed therebetween.

An opening in which a connecting wiring for electrically connecting a semiconductor integrated circuit and a through-wiring is formed is formed by laser beam irradiation. The position of the opening in which the connecting wiring is formed can be determined by determining the position to be irradiated with a laser beam; accordingly, the connecting wiring can be formed selectively and easily.

In addition, several semiconductor integrated circuits, each covered with a prepreg impregnated with an uncured organic resin, are stacked with the prepreg interposed therebetween. Since the uncured organic resin is cured by heating, the semiconductor integrated circuits each covered with a prepreg can be bonded one on top of the other, which makes high integration possible.

When a conductive resin, e.g., a metal paste is contained in a prepreg including an uncured organic resin, the organic resin reacts with paste in the metal paste to be dissolved. Then, metal particles in the metal paste enter the dissolved portion and move through a fiber body, whereby a conductive region for electrically connecting the front and back surfaces of the prepreg is formed. This conductive region serves as a through-wiring.

The position of the through-wiring can be easily determined by determining the position of the conductive resin in the prepreg.

When a conductive region is formed in advance in a prepreg including an uncured organic resin and semiconductor integrated circuits each covered with the prepreg are bonded with the conductive region interposed therebetween, the semiconductor integrated circuits can be electrically connected to each other and a thin, highly integrated semiconductor integrated circuit can be manufactured.

According to one embodiment of the present invention, a method for manufacturing a semiconductor device includes the steps of: forming a first separation layer over a first substrate; forming a first semiconductor element layer over the first separation layer; irradiating the first semiconductor element layer and the first separation layer with a first laser beam, so that a part of the first semiconductor element layer and a part of the first separation layer are removed to form a first opening; forming a first wiring in the first opening, which is electrically connected to the first semiconductor element layer; forming a first protective material over the first semiconductor element layer; forming a first electrode in the first protective material, which is electrically connected to the first wiring; separating the first semiconductor element layer, over which the first protective material is formed, from the first substrate along the first separation layer; forming a second separation layer over a second substrate; forming a second semiconductor element layer over the second separation layer; irradiating the second semiconductor element layer and the second separation layer with a second laser beam, so that a part of the second semiconductor element layer and a part of the second separation layer are removed to form a second opening; forming a second wiring in the second opening, which is electrically connected to the second semiconductor element layer; forming a second protective material over the second semiconductor element layer; forming a second electrode in the second protective material, which is electrically connected to the second wiring; bonding the first semiconductor element layer over the second protective material so that the second electrode is electrically connected to the first wiring; and separating the second semiconductor element layer, over which the second protective material is formed, and the first semiconductor element layer, over which the first protective material is formed, from the second substrate along the second separation layer.

The protective material is a structural body in which a sheet-like fiber body is impregnated with an organic resin.

The first electrode and the second electrode each are made of a conductive resin.

The first laser beam and the second laser beam each are a laser beam having a wavelength of 10 nm to 400 nm, which is in the ultraviolet region, a laser beam having a wavelength of 400 nm to 700 nm, which is in the visible region, or a laser beam having a wavelength of 700 nm to 1 mm, which is in the infrared region.

The first laser beam and the second laser beam each are emitted from any one of an excimer laser, a gas laser, a solid-state laser, and a semiconductor laser.

According to the invention disclosed in this specification, a thin, highly integrated semiconductor integrated circuit having high resistance to external stress can be manufactured. Furthermore, the position of a wiring for electrically connecting semiconductor integrated circuits in the highly integrated semiconductor integrated circuit can be easily determined. Thus, a semiconductor device with less connection failure can be obtained.

DETAILED DESCRIPTION OF THE INVENTION

Figure 1A:
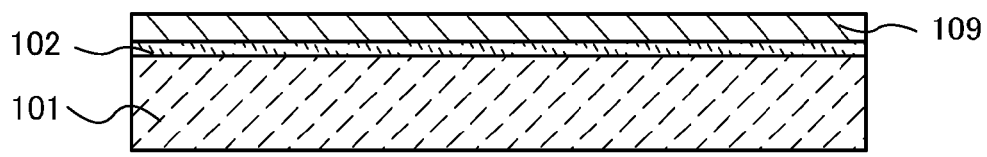
FIGS. 1A to 1F are cross-sectional views illustrating a manufacturing process of a semiconductor device.
Figure 1B:
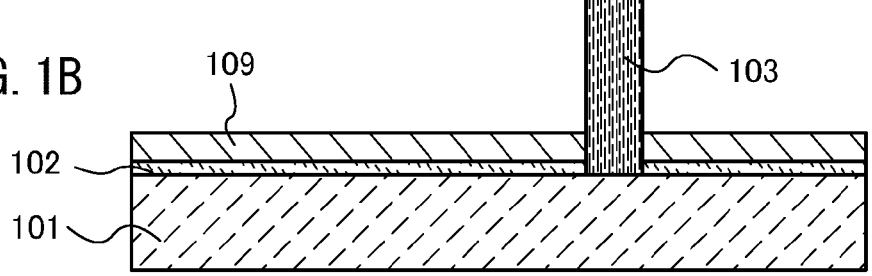

Embodiments of the disclosed invention will be described with reference to drawings. Note that the invention disclosed below can be implemented in a wide variety of modes, and it will be apparent to those skilled in the art that modes and details can be modified without departing from the spirit and scope of the disclosed invention. Accordingly, the present invention should not be construed as being limited to the description of the embodiments given below. Note that in all the drawings shown below, like portions or portions having a similar function are denoted by like reference numerals, and the description thereof is omitted.

Note that a semiconductor device in this specification indicates all the elements and devices that can operate by using semiconductor characteristics, and electric devices such as electronic circuits, liquid crystal display devices, and light-emitting devices, and electronic appliances having the electric devices are all included in the semiconductor devices.

Embodiment 1

This embodiment will be described with reference to FIGS. 1A to 1F, FIGS. 2A to 2D, FIGS. 3A to 3E, FIGS. 4A to 4D, FIGS. 5A to 5D, FIGS. 6A to 6C, FIGS. 7A to 7C, FIGS. 8A and 8B, FIG. 9, FIG. 10, and FIGS. 11A and 11B.

First, a basic manufacturing process of this embodiment will be described with reference to FIGS. 1A to 1F and FIGS. 2A to 2D. After a separation layer 102 is formed over a substrate 101, a semiconductor element layer 109 is formed over the separation layer 102 (see FIG. 1A).

Figure 1C:
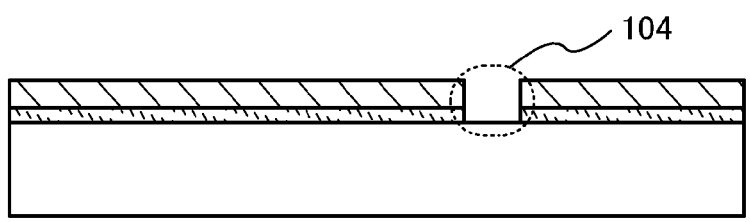

Then, a laser beam 103 is emitted from above the semiconductor element layer 109 (see FIG. 1B), whereby a part of the semiconductor element layer 109 and a part of the separation layer 102 are removed to form an opening 104 (see FIG. 1C).

Figure 1D:
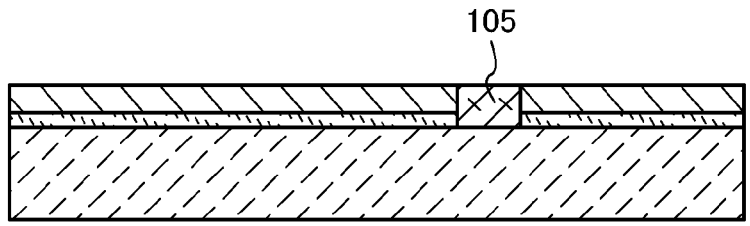

After that, a wiring 105 is formed in the opening 104 to be electrically connected to the semiconductor element layer 109 (see FIG. 1D).

Figure 1E:
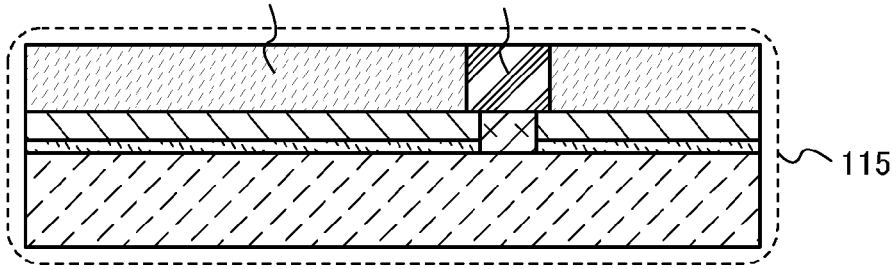

Then, a protective material 106 is formed over the semiconductor element layer 109, and an electrode 107 electrically connected to the wiring 105 is formed in the protective material 106 (see FIG. 1E). The substrate 101, the semiconductor element layer 109, the protective material 106, and the electrode 107 are collectively referred to as a stacked body 115.

Figure 1F:
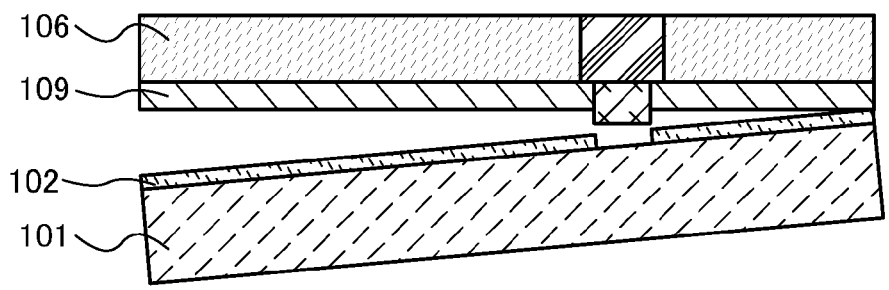

Subsequently, the semiconductor element layer 109 over which the protective material 106 is formed is separated from the substrate 101 along the separation layer 102 (see FIG. 1F). As a result, the wiring 105 electrically connected to the semiconductor element layer 109 is exposed. Here, a stacked structure including the semiconductor element layer 109, the protective material 106, the wiring 105 in the semiconductor element layer 109, and the electrode 107 in the protective material 106 is referred to as a semiconductor circuit element 111.

After the semiconductor circuit element 111 is obtained (see FIG. 2A), the manufacturing steps of FIG. 1A to FIG. 1E are repeated to obtain the structure of FIG. 1E, that is, a stacked structure including a separation layer 102 formed over another substrate 101, a semiconductor element layer 109, a protective material 106, a wiring 105 in the semiconductor element layer 109, and an electrode 107 in the protective material 106. Then, this stacked structure, which is referred to as a second stacked body 115, is bonded to the semiconductor circuit element 111 (referred to as a first semiconductor circuit element 111) of FIG. 2A (see FIG. 2B).

The second stacked body 115 is bonded to the first semiconductor circuit element 111 so that the wiring 105 included in the first semiconductor circuit element 111 is electrically connected to the electrode 107 included in the second stacked body 115.

Figure 2A:
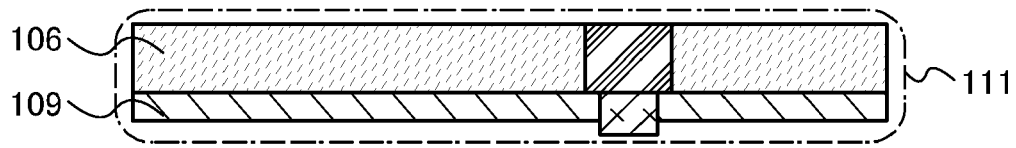
FIGS. 2A to 2D are cross-sectional views illustrating a manufacturing process of a semiconductor device.
Figure 2B:
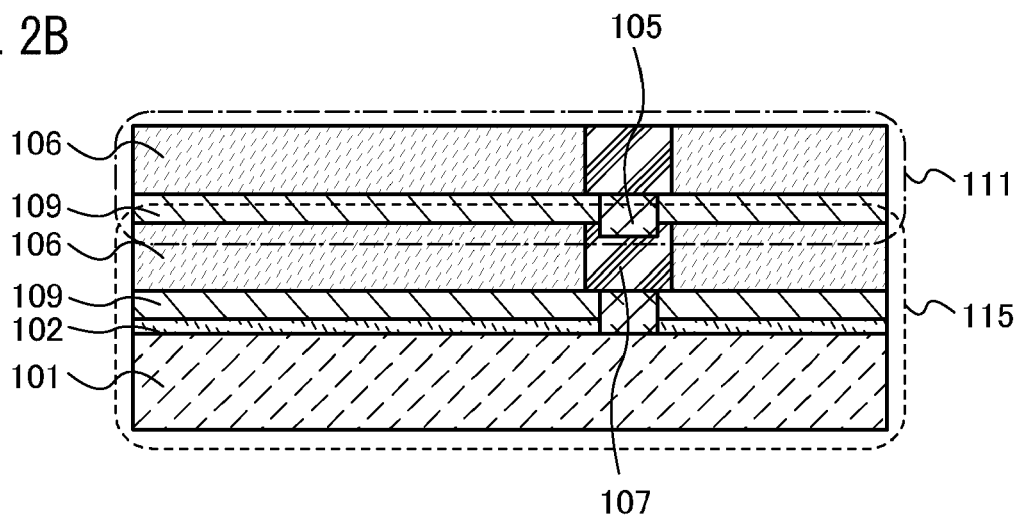
Figure 2C:
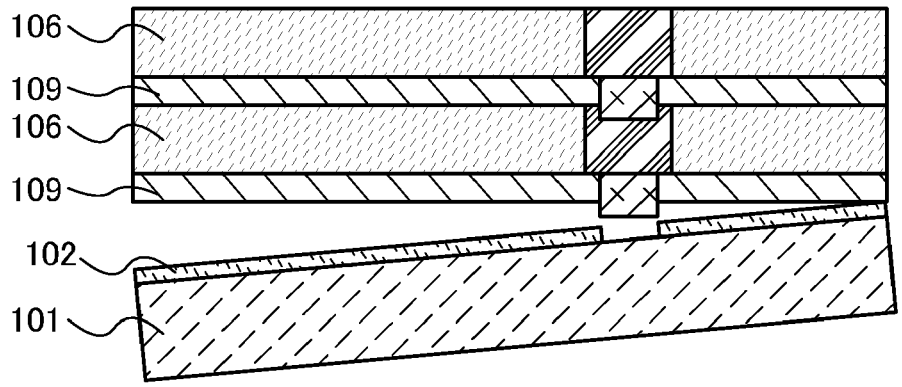

Furthermore, the stacked structure including the semiconductor element layer 109, the protective material 106, the semiconductor element layer 109, and the protective material 106 is separated from the substrate 101 along the separation layer 102 (see FIG. 2C).

Figure 2D:
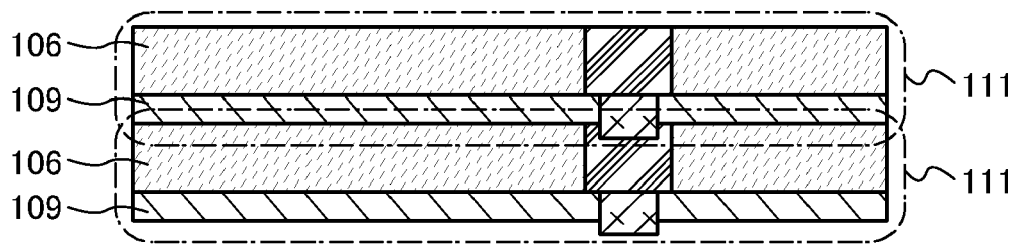

Through the above steps, the stacked structure including two pairs of the semiconductor element layer 109 and the protective material 106 can be obtained (see FIG. 2D). In order to obtain a more highly integrated device, the manufacturing steps of FIGS. 2B to 2D may be further repeated.

A case of forming a thin film transistor (TFT) as the semiconductor element layer 109 will be described below with reference to FIGS. 3A to 3E, FIGS. 4A to 4D, FIGS. 5A to 5D, FIGS. 6A to 6C, FIGS. 7A to 7C, FIGS. 8A and 8B, FIG. 9, FIG. 10, and FIGS. 11A and 11B.

First, the separation layer 102 is formed over the substrate 101 having an insulating surface.

The substrate 101 having an insulating surface is typically a glass substrate, a quartz substrate, a ceramic substrate, a metal substrate having at least one surface on which an insulating layer is formed, an organic resin substrate, or the like. Here, a glass substrate is used as the substrate 101 having an insulating surface.

The separation layer 102 is formed by sputtering, plasma CVD, coating, printing, or the like to have a single-layer structure or a multi-layered structure. Each of the layers has a thickness of 30 nm to 200 nm, and is made of an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), and silicon (Si), or an alloy material or a compound containing any of these elements as its main component. The crystalline structure of a layer containing silicon may be any one of an amorphous structure, a microcrystalline structure, and a polycrystalline structure. Note that the coating is a method by which a solution is discharged on an object under process to form a film, and includes, for example, spin coating and droplet discharging. The droplet discharging is a method by which a droplet of a composition containing fine particles is discharged from a small hole to form a predetermined pattern.

In the case where the separation layer 102 has a single-layered structure, it is preferable to form a tungsten layer, a molybdenum layer, or a layer containing a mixture of tungsten and molybdenum. It is possible to use a layer containing oxide or oxynitride of tungsten, oxide or oxynitride of molybdenum, or oxide or oxynitride of a mixture of tungsten and molybdenum. Note that the mixture of tungsten and molybdenum corresponds to, for example, an alloy of tungsten and molybdenum.

In the case where the separation layer 102 has a multi-layered structure, it is preferable that a metal layer be formed as a first layer and a metal oxide layer be formed as a second layer. Typically, the first metal layer is made of tungsten, molybdenum, or a mixture of tungsten and molybdenum, and the second layer is made of oxide of tungsten, molybdenum, or a mixture of tungsten and molybdenum, of nitride of tungsten, molybdenum, or a mixture of tungsten and molybdenum, of oxynitride of tungsten, molybdenum, or a mixture of tungsten and molybdenum, or of nitride oxide of tungsten, molybdenum, or a mixture of tungsten and molybdenum.

In the case where the separation layer 102 has a multi-layered structure in which a metal layer is formed as a first layer and a metal oxide layer is formed as a second layer, the separation layer 102 may be formed in the following manner: a layer containing tungsten is formed as the metal layer and an insulating layer made of oxide is formed thereover, whereby a layer containing oxide of tungsten is formed as the metal oxide layer at the interface between the tungsten layer and the insulating layer. Alternatively, the metal oxide layer may be formed by performing thermal oxidation treatment, oxygen plasma treatment, treatment with a highly oxidizing solution such as ozone water, or the like on the surface of the metal layer.

Examples of oxide of tungsten are $WO_2$, $W_2O_5$, $W_4O_{11}$, and $WO_3$.

Although in the above process the separation layer 102 is formed in contact with the substrate 101 having an insulating surface, the present invention is not limited to that process. An insulating layer may be formed as a base in contact with the substrate 101 having an insulating surface, and then the separation layer 102 may be formed in contact with the insulating layer. Here, a tungsten layer with a thickness of 30 nm to 70 nm is formed as the separation layer 102 by sputtering.

An insulating film 156 is formed as a base layer over the separation layer 102. An island-like semiconductor film 161 including impurity regions 153a and 153b and a channel formation region 163a, and an island-like semiconductor film 162 including impurity regions 159a and 159b and a channel formation region 163b are formed over the insulating film 156. A gate insulating film 154 is formed to cover the island-like semiconductor film 161 and the island-like semiconductor film 162. A gate electrode 155a is formed over the channel formation region 163a with the gate insulating film 154 interposed therebetween, and a gate electrode 155b is formed over the channel formation region 163b with the gate insulating film 154 interposed therebetween (see FIG. 3A).

Note that an impurity element imparting one conductivity type is added to the impurity regions 153a and 153b using the gate electrode 155a as a mask. On the other hand, an impurity element imparting one conductivity type is added to the impurity regions 159a and 159b using the gate electrode 155b as a mask. The impurity element added to the impurity regions 153a and 153b and the impurity element added to the impurity regions 159a and 159b may have the same conductivity type or opposite conductivity types.

Figure 3A:
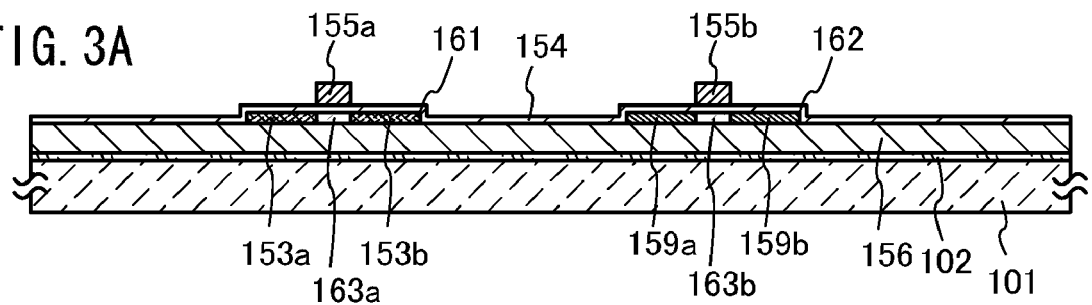
FIGS. 3A to 3E are cross-sectional views illustrating a manufacturing process of a semiconductor device.
Figure 3B:
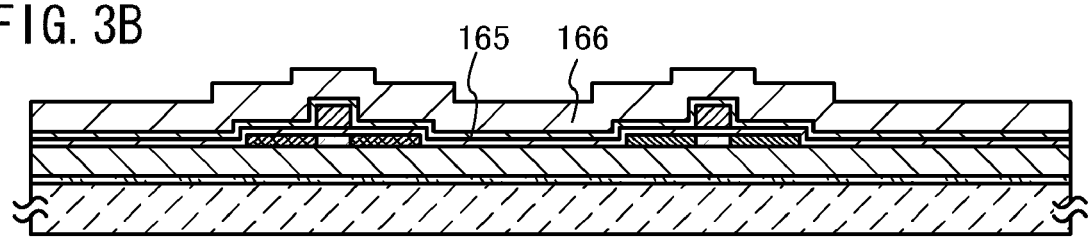
Figure 3C:
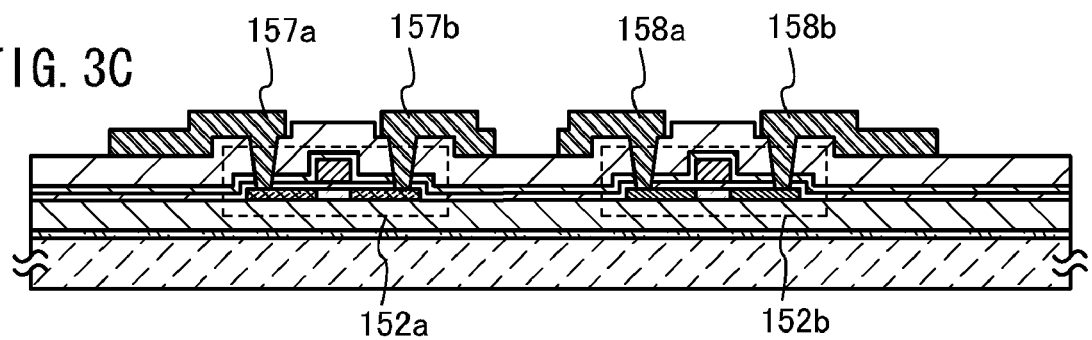

Then, an insulating film 165 is formed to cover the gate insulating film 154, the gate electrode 155a, and the gate electrode 155b, and an insulating film 166 is formed over the insulating film 165 (see FIG. 3B).

The insulating film 165 may be made of, for example, a silicon nitride film. The insulating film 166 may be made of any one of a silicon oxide film, a silicon nitride film, a silicon nitride film containing oxygen, and a silicon oxide film containing nitrogen, a multi-layer film including a plurality of these films, or an organic insulating film.

A wiring 157a and a wiring 157b that are electrically connected to the impurity regions 153a and 153b, respectively, in the island-like semiconductor film 161 are formed over the insulating film 166. Furthermore, a wiring 158a and a wiring 158b that are electrically connected to the impurity regions 159a and 159b, respectively, in the island-like semiconductor film 162 are formed over the insulating film 166 (see FIG. 3C).

Figure 3D:
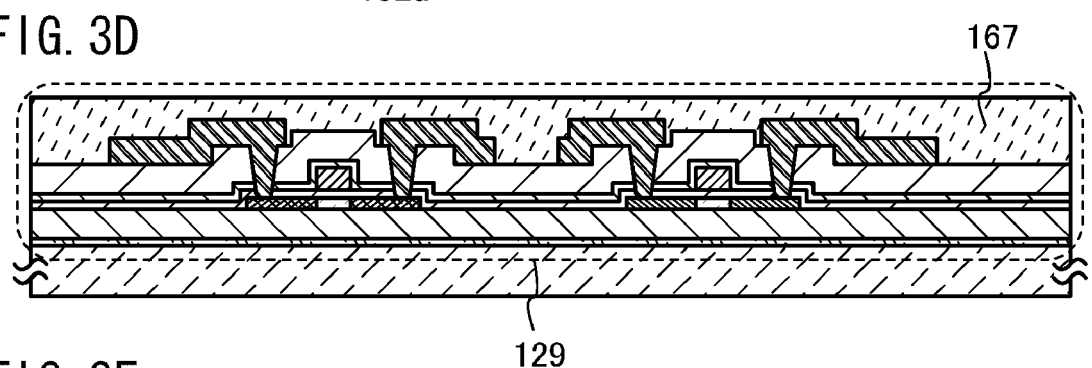

Then, an insulating film 167 is formed to cover the insulating film 166, the wiring 157a, the wiring 157b, the wiring 158a, and the wiring 158b (see FIG. 3D). The insulating film 167 may be formed of any one of a silicon oxide film, a silicon nitride film, a silicon nitride film containing oxygen, and a silicon oxide film containing nitrogen, a multi-layer film including a plurality of these films, or an organic insulating film.

A stacked structure from the insulating film 156 to the insulating film 167 illustrated in FIG. 3D, namely, a stacked structure including the insulating film 156, the island-like semiconductor film 161, the island-like semiconductor film 162, the gate insulating film 154, the gate electrode 155a, the gate electrode 155b, the insulating film 165, the insulating film 166, the wiring 157a, the wiring 157b, the wiring 158a, the wiring 158b, and the insulating film 167 is similar to the semiconductor element layer 109 illustrated in FIG. 1A. Accordingly, this stacked structure is referred to as a semiconductor element layer 129.

Figure 3E:
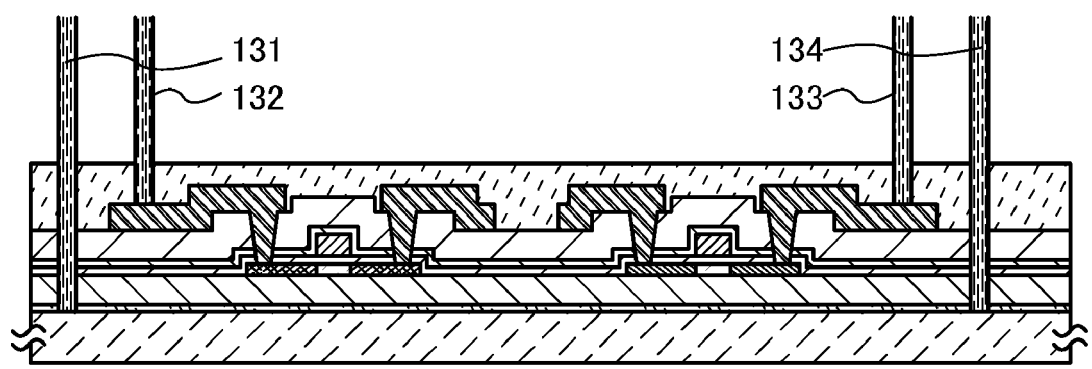

Then, a laser beam 131 reaching the separation layer 102, a laser beam 132 reaching the wiring 157a, a laser beam 133 reaching the wiring 158b, and a laser beam 134 reaching the separation layer 102 are emitted from above the surface of the insulating film 167 (see FIG. 3E). The laser beams 131 to 134 correspond to the laser beam 103 of FIG. 1B.

As the laser beams 131 to 134, it is preferable to use a laser beam having a wavelength which is absorbed by the insulating film 167, the insulating film 166, the insulating film 165, the gate insulating film 154, and the insulating film 156. Typically, a laser beam having a wavelength in the ultraviolet region (10 nm to 400 nm), in the visible region (400 nm to 700 nm), or in the infrared region (700 nm to 1 mm) is selected as appropriate for the irradiation.

As a laser for emitting such laser beams 131 to 134, it is possible to use an excimer laser such as a KrF, ArF, or XeCl laser; a gas laser such as a He, He—Cd, Ar, He—Ne, HF, or $CO_2$ laser; a solid-state laser such as a crystal laser in which crystals such as YAG, $GdVO_4$, $YVO_4$, YLF, or $YAlO_3$ are doped with Cr, Nd, Er, Ho, Ce, Co, Ti, or Tm, a glass laser, or a ruby laser; or a semiconductor laser such as a GaN, GaAs, GaAlAs, or InGaAsP laser. In the case of using a solid-state laser, one of the fundamental wave to the fifth harmonic wave is preferably used.

Figure 4A:
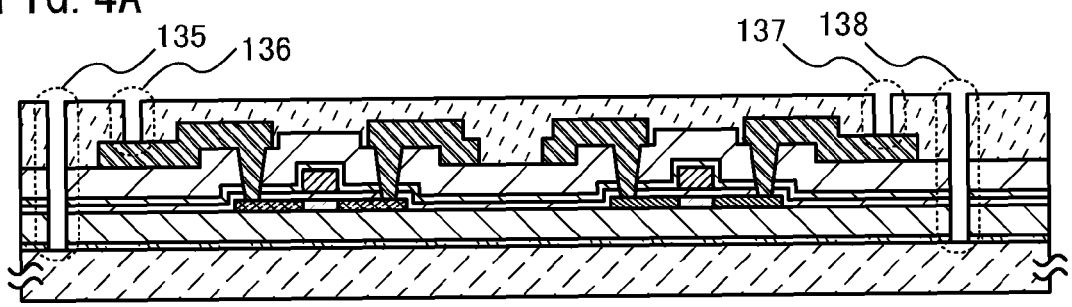
FIGS. 4A to 4D are cross-sectional views illustrating a manufacturing process of a semiconductor device.

By irradiation with the laser beam 131, the laser beam 132, the laser beam 133, and the laser beam 134 illustrated in FIG. 3E, an opening 135 in which a part of the separation layer 102 is exposed, an opening 136 in which the wiring 157a is exposed, an opening 137 in which the wiring 158b is exposed, and an opening 138 in which another part of the separation layer 102 is exposed are obtained, respectively (see FIG. 4A). The openings 135 to 138 correspond to the opening 104 of FIG. 1C.

Figure 4B:
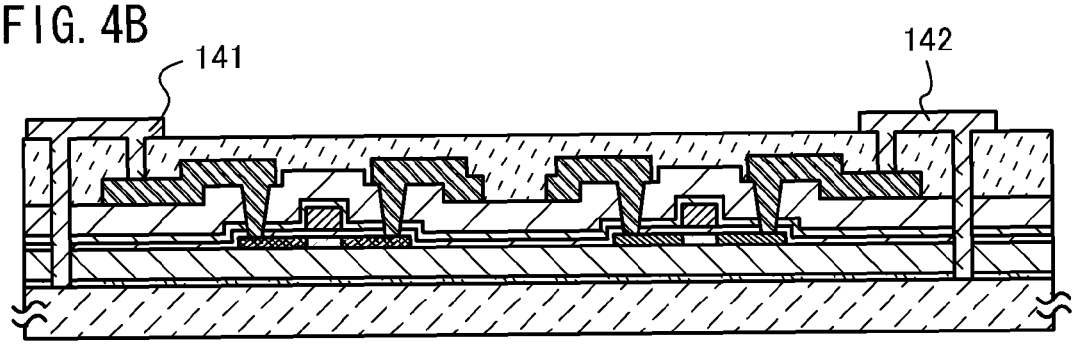

Next, a wiring 141 reaching the wiring 157a and the separation layer 102 through the opening 135 and the opening 136, and a wiring 142 reaching the wiring 158b and the separation layer 102 through the opening 137 and the opening 138 are formed over the insulating film 167 (see FIG. 4B). The wiring 141 and the wiring 142 correspond to the wiring 105 of FIG. 1D.

Figure 4C:
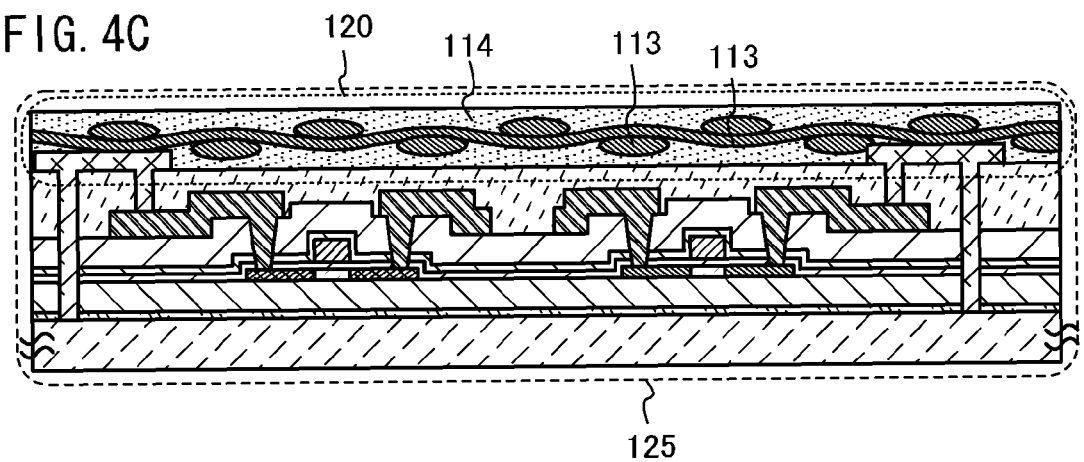

Then, a structural body 120 in which a sheet-like fiber body 113 is impregnated with an organic resin 114 is provided over the insulating film 167, the wiring 141, and the wiring 142 (see FIG. 4C). Such a structural body 120 is also called a prepreg. A prepreg is specifically formed in such a manner that, after a sheet-like fiber body is impregnated with a composition in which a matrix resin is diluted with an organic solvent, drying is performed so that the organic solvent is volatilized and the matrix resin is semi-cured. The structural body 120 corresponds to the protective material 106 of FIG. 1E.

In the drawings of this specification, the sheet-like fiber body 113 is illustrated as a woven fabric which is plain-woven from a bundle of yarns having an elliptical cross section. Although the TFT 152a and the TFT 152b are larger than the bundle of yarns of the sheet-like fiber body 113, the TFT 152a and the TFT 152b are smaller than the bundle of yarns of the sheet-like fiber body 113 in some cases.

Here, the structural body (also referred to as a prepreg) 120 including the sheet-like fiber body 113 and the organic resin 114 will be described in detail with reference to FIGS. 8A and 8B, FIG. 9, FIG. 10, and FIGS. 11A and 11B.

Figure 8A:
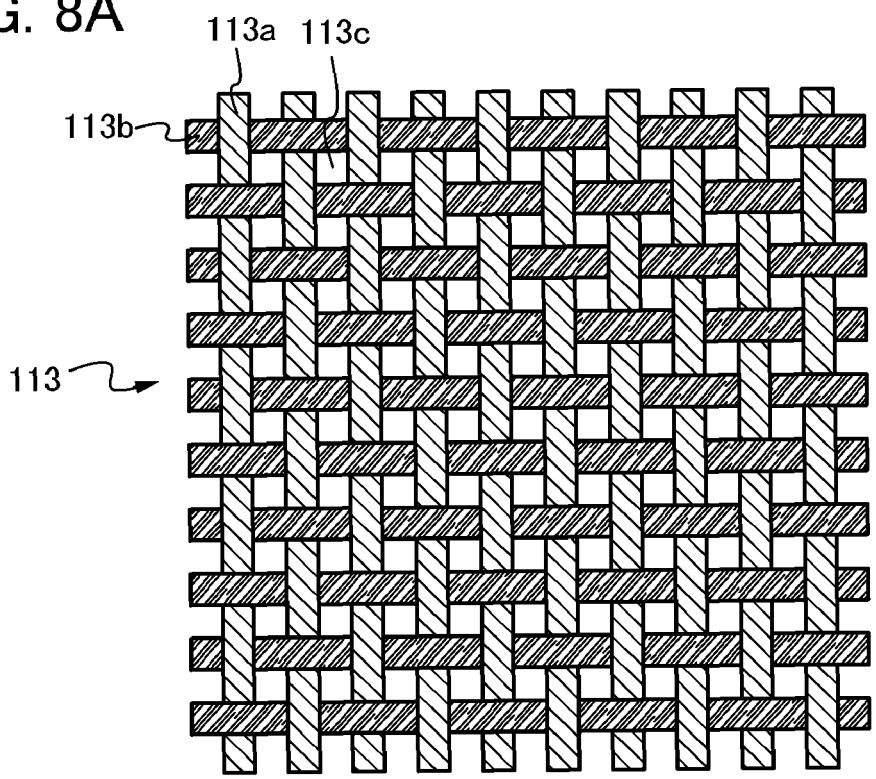
FIGS. 8A and 8B are top views of sheet-like fiber bodies.
Figure 8B:
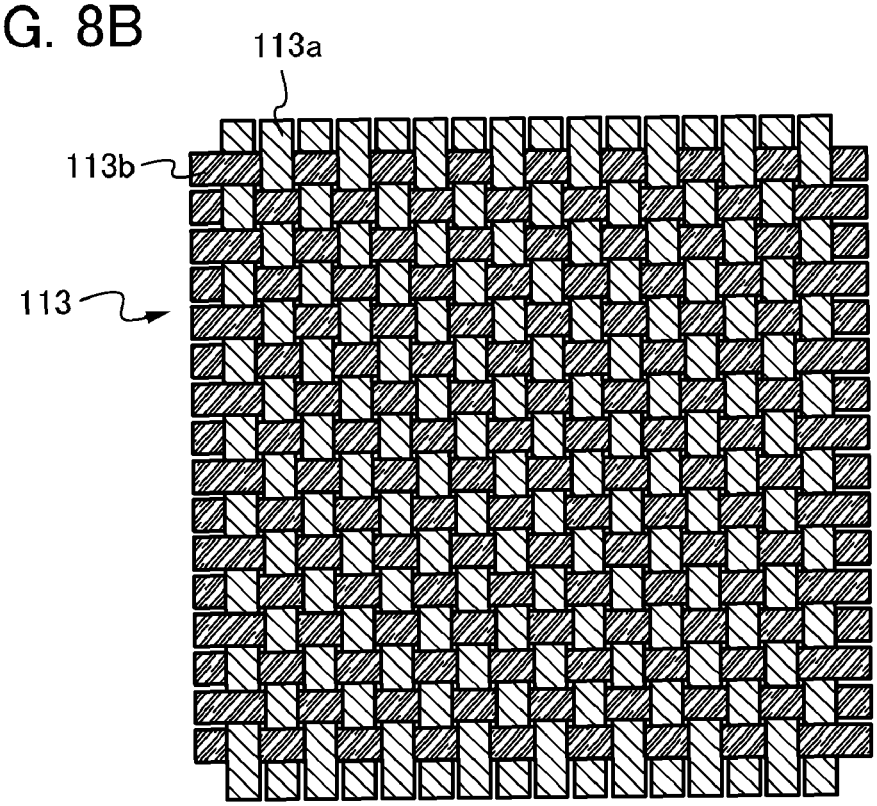
Figure 11A:
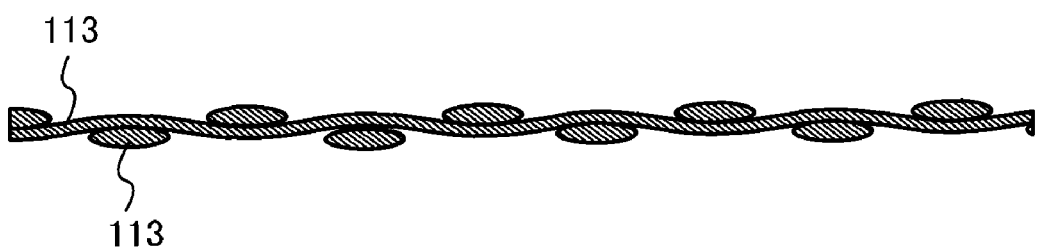
FIGS. 11A and 11B are cross-sectional views of a sheet-like fiber body.
Figure 11B:
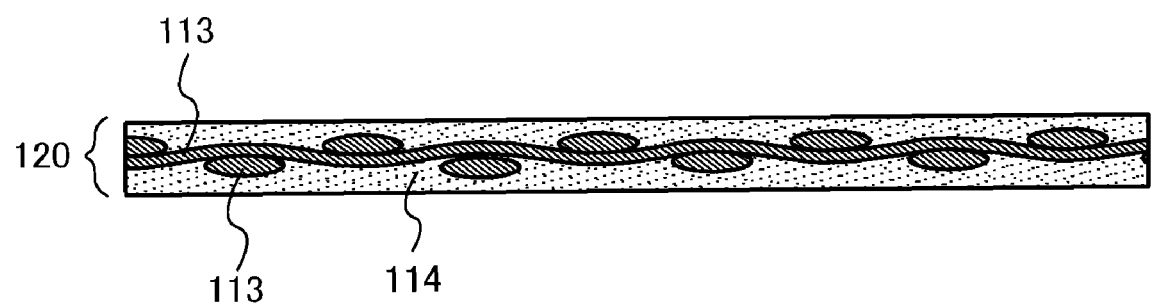

FIGS. 8A and 8B are top views of woven fabrics which may be included in the sheet-like fiber body 113 and are woven from a bundle of yarns used for warp yarns and weft yarns. FIG. 11A is a cross-sectional view of FIGS. 8A and 8B, and FIG. 11B is a cross-sectional view of the structural body 120 in which the sheet-like fiber body 113 is impregnated with the organic resin 114.

The sheet-like fiber body 113 is a woven fabric or nonwoven fabric of an organic compound or an inorganic compound. As the sheet-like fiber body 113, a high-strength fiber of an organic compound or an inorganic compound may be used.

The sheet-like fiber body 113 may include a woven fabric which is woven from a bundle of fibers (single yarns) (hereinafter, referred to as a bundle of yarns) used for warp yarns and weft yarns, or a nonwoven fabric obtained by stacking bundles of plural kinds of fibers randomly or regularly. In the case of a woven fabric, a plain-woven fabric, a twilled fabric, a satin-woven fabric, or the like can be used as appropriate.

The bundle of yarns may have a circular or elliptical cross section. The bundle of yarns may be subjected to fiber opening with a high-pressure water stream, high-frequency vibration using liquid as a medium, continuous ultrasonic vibration, pressing with a roller, or the like. The bundle of yarns, which has been subjected to fiber opening, has a large width and has an elliptical or flat cross section, which results in a reduction in the number of single yarns in the thickness direction. Furthermore, with the use of a loosely twisted yarn as the bundle of yarns, the bundle of yarns is easily flattened and has an elliptical or flat cross section. By using such a bundle of yarns having an elliptical or flat cross section, the thickness of the sheet-like fiber body 113 can be reduced. Accordingly, the thickness of the structural body 120 can be reduced and a thin semiconductor device can be manufactured.

As illustrated in FIG. 8A, the sheet-like fiber body 113 is woven from regularly-spaced warp yarns 113a and regularly-spaced weft yarns 113b. Such a fiber body has regions (referred to as basket holes 113c) where neither the warp yarns 113a nor the weft yarns 113b exist. Such a sheet-like fiber body 113 is impregnated with a large amount of the organic resin 114, resulting in a strong adhesion of the sheet-like fiber body 113. Note that the basket holes 113c in the structural body 120 include neither the warp yarns 113a nor the weft yarns 113b, but are filled with the organic resin 114.

As illustrated in FIG. 8B, the sheet-like fiber body 113 may have a high density of the warp yarns 113a and the weft yarns 113b so that the proportion of the basket holes 113c is low. It is typically preferable for each of the basket holes 113c to have a size smaller than that of the area locally pressed. Typically, each of the basket holes 113c preferably has a rectangular shape with a side length of 0.01 mm to 0.2 mm. If each of the basket holes 113c in the sheet-like fiber body 113 has such a small area, even when pressure is applied by a member with a sharp tip (typically, a writing instrument such as a pen or a pencil), the pressure can be absorbed by the entire sheet-like fiber body 113.

Furthermore, in order to enhance the permeability of the organic resin 114 into the bundle of yarns, the bundle of yarns may be subjected to surface treatment. For example, corona discharge or plasma discharge may be performed to activate the surface of the bundle of yarns. Alternatively, the surface treatment may be performed using a silane coupling agent or a titanate coupling agent.

A high-strength fiber is specifically a fiber with a high tensile modulus of elasticity or a fiber with a high Young's modulus. As typical examples of the high-strength fiber, there are a polyvinyl alcohol fiber, a polyester fiber, a polyamide fiber, a polyethylene fiber, an aramid fiber, a polyparaphenylene benzobisoxazole fiber, a glass fiber, and a carbon fiber.

As the glass fiber, a glass fiber using E glass, S glass, D glass, Q glass, or the like can be used. Note that the sheet-like fiber body 113 may be formed of one kind of the above high-strength fibers or plural kinds of the above high-strength fibers.

As the organic resin 114 with which the sheet-like fiber body 113 is impregnated, it is possible to use a thermosetting resin such as an epoxy resin, an unsaturated polyester resin, a polyimide resin, a bismaleimide-triazine resin, or a cyanate resin. Alternatively, a thermoplastic resin such as a polyphenylene oxide resin, a polyetherimide resin, or a fluorine resin may be used as the organic resin 114. Furthermore, a plurality of the above thermosetting resins and thermoplastic resins may be used. By using the aforementioned organic resin, the sheet-like fiber body can be firmly bonded to the semiconductor element layer by heat treatment. Note that the organic resin 114 preferably has a high glass transition temperature, so that the organic resin 114 is less likely to be damaged by locally applied force.

Highly thermally-conductive filler may be dispersed in the organic resin 114 or the bundle of fiber yarns. As the highly thermally-conductive filler, aluminum nitride, boron nitride, silicon nitride, alumina, or the like can be used. Alternatively, metal particles such as silver or copper particles may be used as the highly thermally-conductive filler. When the highly thermally-conductive filler is included in the organic resin or the bundle of fiber yarns, heat generated in the element layer can be easily released to the outside. Accordingly, thermal accumulation in the semiconductor device can be suppressed and thus damage to the semiconductor device can be reduced.

Figure 9:
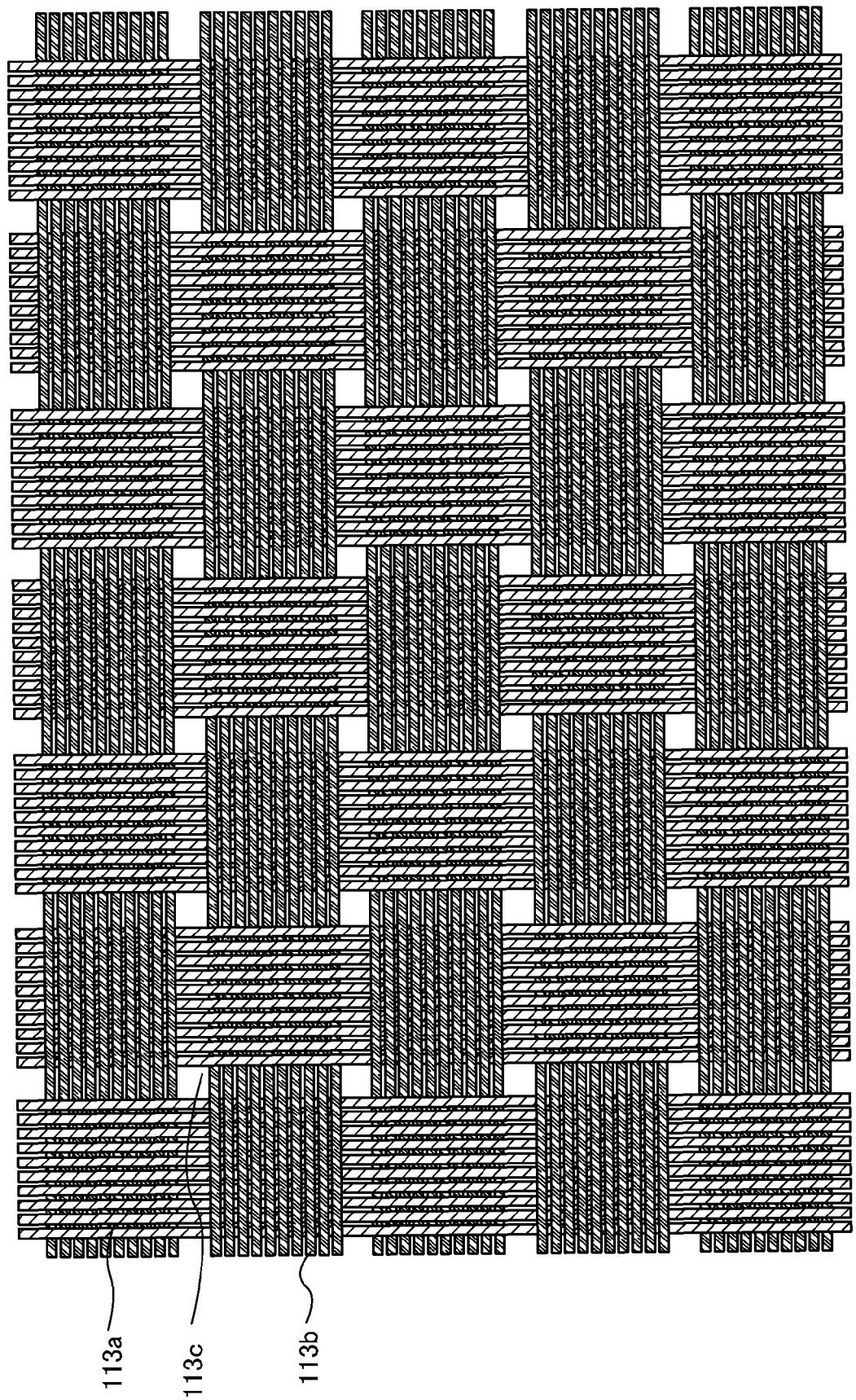
FIG. 9 is a top view of a sheet-like fiber body.
Figure 10:
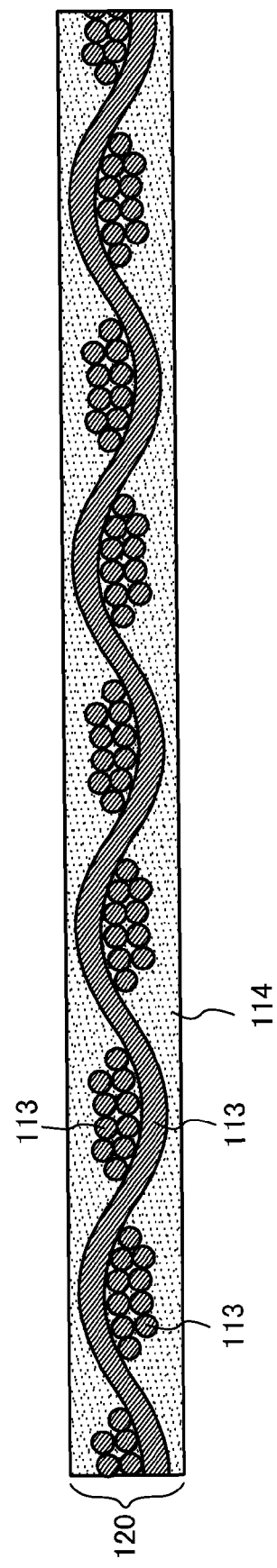
FIG. 10 is a cross-sectional view of a sheet-like fiber body.

FIGS. 8A and 8B illustrate the sheet-like fiber bodies, each of which is woven from intersecting pairs of one warp yarn and one weft yarn. However, the number of warp yarns and weft yarns is not limited to this, and may be determined as appropriate. For example, FIG. 9 and FIG. 10 are respectively a top view and a cross-sectional view of a sheet-like fiber body that is woven from intersecting pairs of a bundle of ten warp yarns and a bundle of ten weft yarns. Note that in FIG. 10, the sheet-like fiber body 113 is impregnated with the organic resin 114 to form the structural body 120.

Figure 4D:
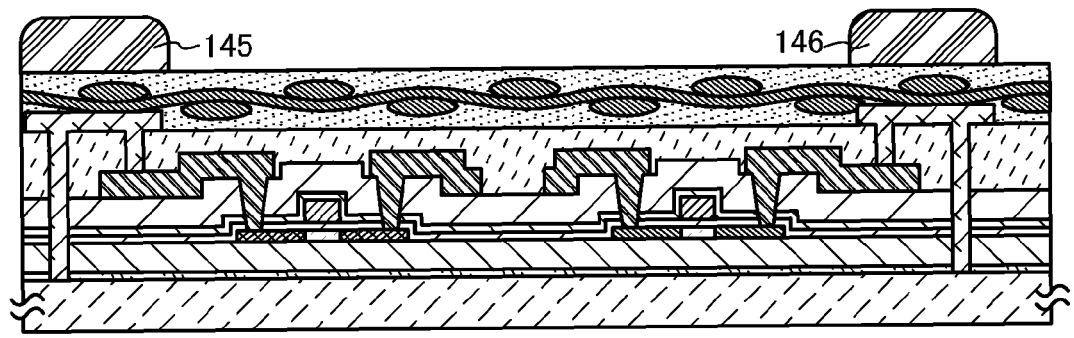

Next, a conductive resin 145 and a conductive resin 146 are formed over the structural body 120 so as to overlap the wiring 141 and the wiring 142, respectively (see FIG. 4D). In this embodiment, a conductive paste containing a metal element, e.g., a silver paste is used as the conductive resin 145 and the conductive resin 146. The metal element may be contained as metal particles in the conductive paste.

The conductive paste may be a paste containing any of copper (Cu), silver (Ag), nickel (Ni), gold (Au), platinum (Pt), palladium (Pd), tantalum (Ta), molybdenum (Mo), and titanium (Ti).

The conductive resin 145 and the conductive resin 146 may be provided over the structural body 120 by screen printing, ink-jet, or the like.

When the conductive resin 145 and the conductive resin 146 are provided over the structural body 120, the organic resin 114 in the structural body 120 reacts with components in the conductive resin 145 and the conductive resin 146, such as pastes if the conductive pastes are used, so that the organic resin 114 is partially dissolved. Thus, metal particles in the conductive resin 145 and the conductive resin 146 penetrate through the sheet-like fiber body 113, whereby the conductive resin 145 and the conductive resin 146 move to a surface (a second surface) opposite to the surface (a first surface) on which the conductive resin 145 and the conductive resin 146 are formed first. As a result, a through-electrode is formed inside the structural body 120 (see FIG. 5A). The conductive resin 145 and the conductive resin 146 correspond to the electrode 107 of FIG. 1E.

The area of each of the conductive resin 145 and the conductive resin 146 on the second surface of the structural body 120 may be smaller or larger than the area thereof on the first surface. In other words, the conductive resin 145 and the conductive resin 146 may move inside the structural body 120 while shrinking or expanding.

Since no through-hole (also referred to as a contact hole) is formed in the structural body 120, that is, the sheet-like fiber body 113 is not cut, electrical connection between the opposite surfaces of the structural body 120 can be formed while maintaining the strength of the structural body 120.

After that, a heating step and a pressure bonding step are performed to cure the organic resin 114 in the structural body 120, which has not been dissolved.

Here, a stacked structure including the substrate 101, the separation layer 102, the semiconductor element layer 129, the structural body 120, the conductive resin 145, and the conductive resin 146 is referred to as a stacked body 125.

Figure 5A:
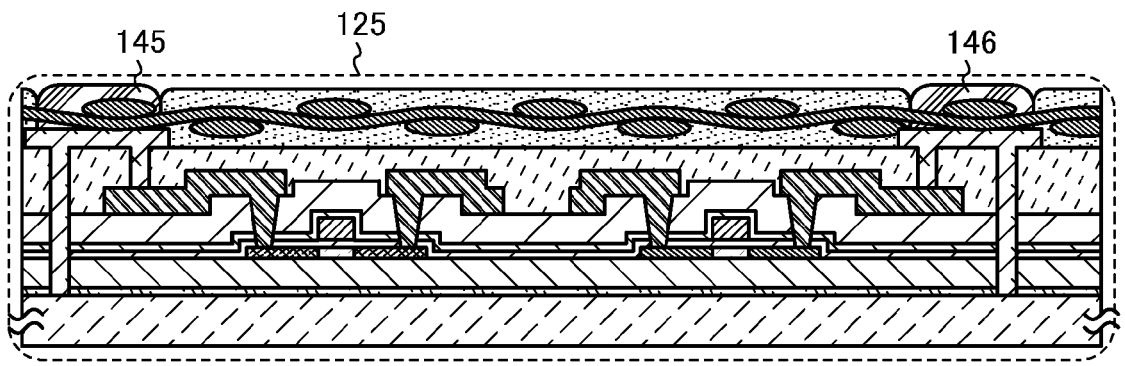
FIGS. 5A to 5D are cross-sectional views illustrating a manufacturing process of a semiconductor device.
Figure 5B:
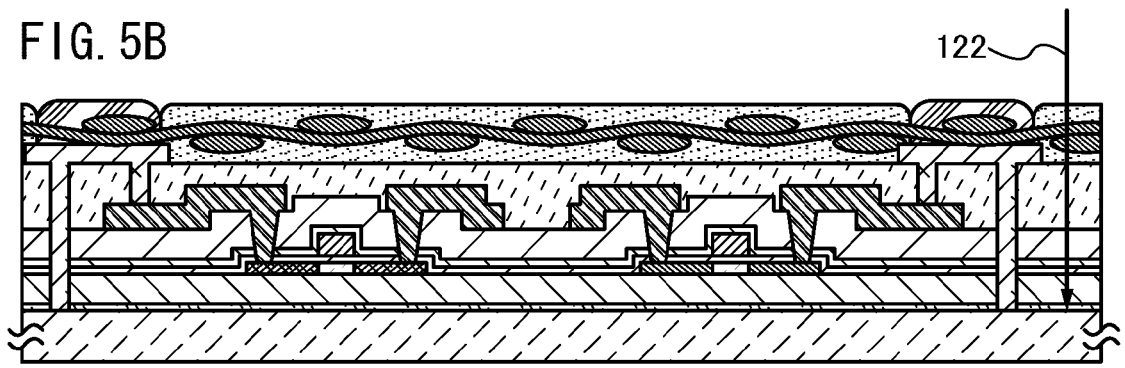
Figure 5C:
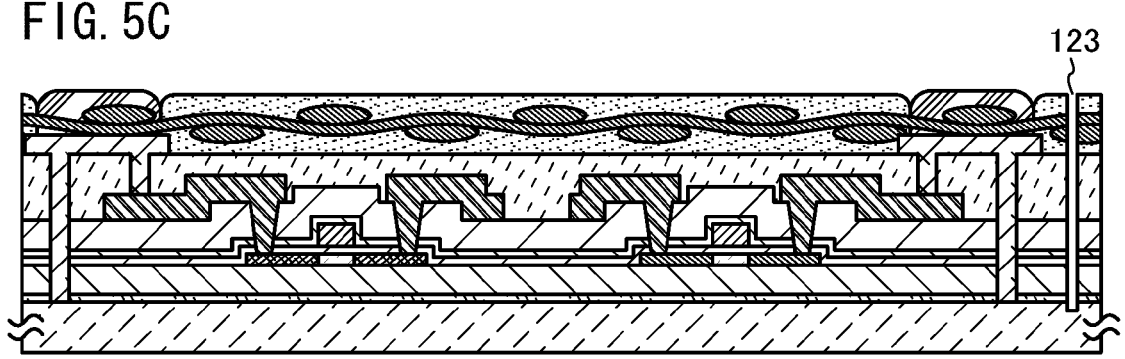

Next, in order to facilitate a subsequent separation step, the structural body 120, the semiconductor element layer 129, and the separation layer 102 may be irradiated with a laser beam 122 from the side of the structural body 120 as illustrated in FIG. 5B, so that a groove 123 can be formed as illustrated in FIG. 5C.

As the laser beam 122 that is emitted to form the groove 123, it is preferable to use a laser beam having a wavelength absorbed by the separation layer 102, the semiconductor element layer 129, and the layers included in the structural body 120. Typically, a laser beam having a wavelength in the ultraviolet region (10 nm to 400 nm), in the visible region (400 nm to 700 nm), or in the infrared region (700 nm to 1 mm) is selected as appropriate for the irradiation.

As a laser for emitting such a laser beam 122, it is possible to use an excimer laser such as a KrF, ArF, or XeCl laser; a gas laser such as a He, He—Cd, Ar, He—Ne, HF, or $CO_2$ laser; a solid-state laser such as a crystal laser in which crystals such as YAG, $GdVO_4$, $YVO_4$, YLF, or $YAlO_3$ are doped with Cr, Nd, Er, Ho, Ce, Co, Ti, or Tm, a glass laser, or a ruby laser; or a semiconductor laser such as a GaN, GaAs, GaAlAs, or InGaAsP laser. In the case of using a solid-state laser, one of the the fundamental wave to the fifth harmonic wave is preferably used.

Figure 5D:
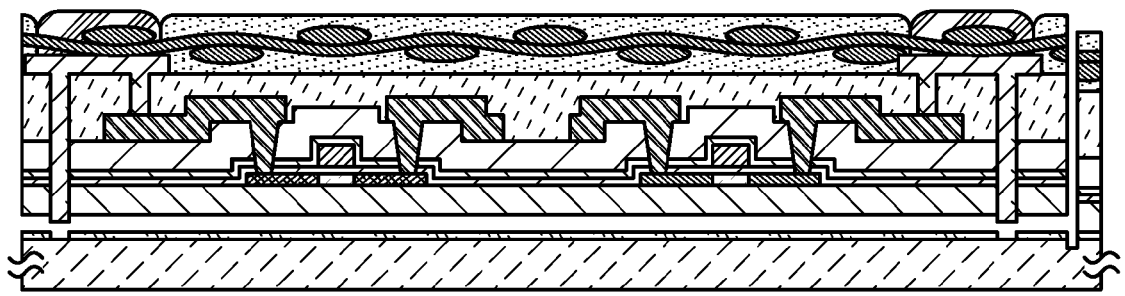

Then, as illustrated in FIG. 5D, by using the groove 123 as a trigger, a part of the semiconductor element layer 129 and a part of the structural body 120 are separated from the substrate 101 having an insulating surface over which the separation layer 102 is provided, by a physical means along the interface between the separation layer 102 and the insulating film 156. In this embodiment, the part of the semiconductor element layer 129 and the part of the structural body 120 that have been separated are collectively referred to as a semiconductor circuit element 171 (see FIG. 6A). The manufacturing step of FIG. 5D corresponds to the manufacturing step of FIG. 1F.

The physical means refers to a dynamic means or a mechanical means of applying some dynamic energy (mechanical energy). Typically, the physical means is to apply mechanical force (such as pulling by hand or a gripping tool, or separation while rotating a roller). In that case, separation can be further facilitated by providing the surface of the structural body 120 with an adhesive sheet that can be separated by light or heat.

Alternatively, the semiconductor element layer 129 may be separated from the separation layer 102 by dropping a liquid into the groove 123 so that the liquid penetrates into the interface between the separation layer 102 and the insulating film 156. In that case, a liquid may be dropped only into the groove 123, or the substrate 101 having an insulating surface, the semiconductor element layer 129, and the structural body 120 may be entirely soaked in a liquid so that the liquid penetrates from the groove 123 into the interface between the separation layer 102 and the semiconductor element layer 129.

Further alternatively, a fluoride gas such as $NF_3$, $BrF_3$, or $ClF_3$ may be introduced into the groove 123 in FIG. 5C and the separation layer 102 may be removed by etching with the use of the fluoride gas, whereby the semiconductor circuit element 171 is separated from the substrate 101 having an insulating surface.

Figure 6A:
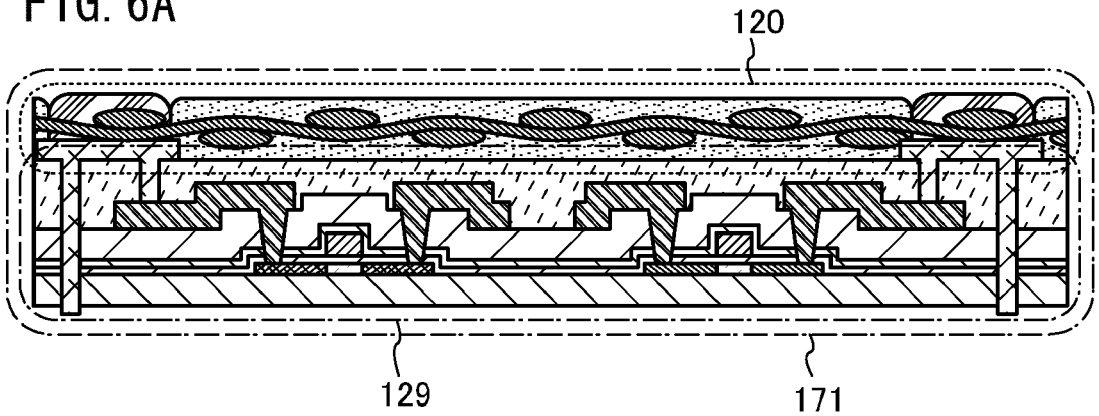
FIGS. 6A to 6C are cross-sectional views illustrating a manufacturing process of a semiconductor device.

The semiconductor circuit element 171 that has been separated includes the semiconductor element layer 129 and the structural body 120 (see FIG. 6A). As a result, the wiring 141 and the wiring 142 are exposed. The semiconductor circuit element 171 corresponds to the semiconductor circuit element 111 of FIG. 2A.

Figure 6B:
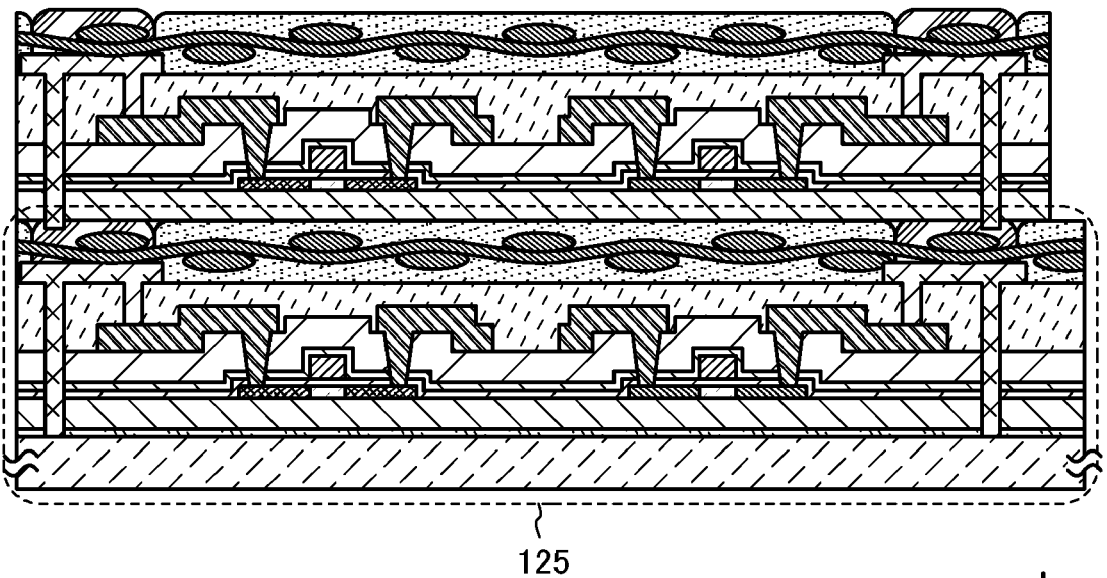
Figure 6C:
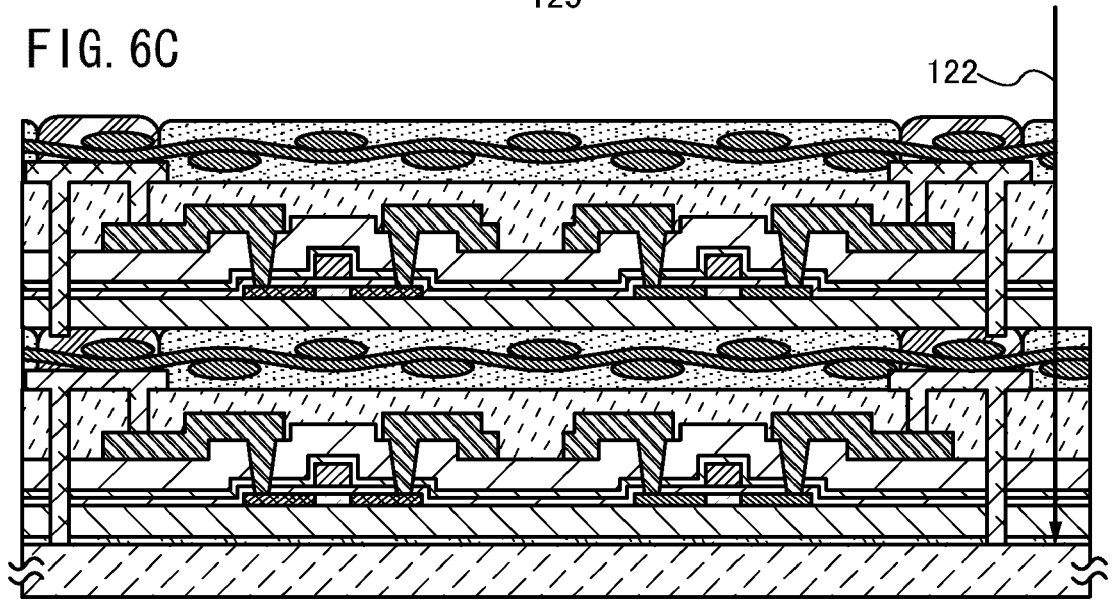

Then, another stacked body 125 is manufactured, and the semiconductor circuit element 171 is provided over the other stacked body 125 (see FIG. 6B). Note that the manufacturing step of FIG. 6B corresponds to the manufacturing step of FIG. 2B.

The wiring 141 in the semiconductor circuit element 171 is electrically connected to the conductive resin 145 in the other stacked body 125, and the wiring 142 in the semiconductor circuit element 171 is electrically connected to the conductive resin 146 in the other stacked body 125, whereby the circuit including the TFT 152a and the TFT 152b in the semiconductor circuit element 171 is electrically connected to a circuit including a TFT 152a and a TFT 152b in the other stacked body 125. Note that the electrodes and the conductive resins to be electrically connected may be changed as needed.

Figure 7A:
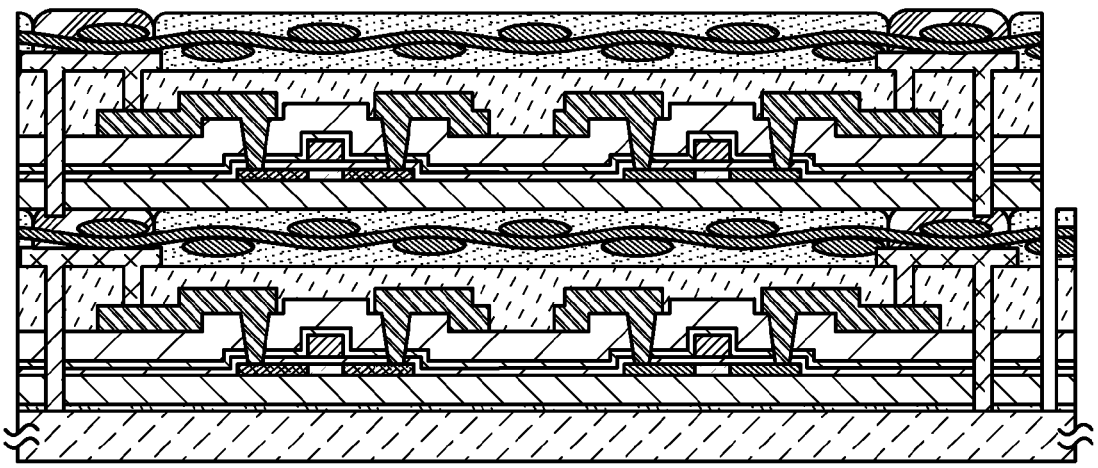
FIGS. 7A to 7C are cross-sectional views illustrating a manufacturing process of a semiconductor device.

Next, as in the manufacturing step of FIG. 5B, the structural body 120, the semiconductor element layer 129, and the separation layer 102 are irradiated with a laser beam 122 from the side of the other stacked body 125 (see FIG. 6C), so that a groove 123 is formed in the other stacked body 125 (see FIG. 7A).

Figure 7B:
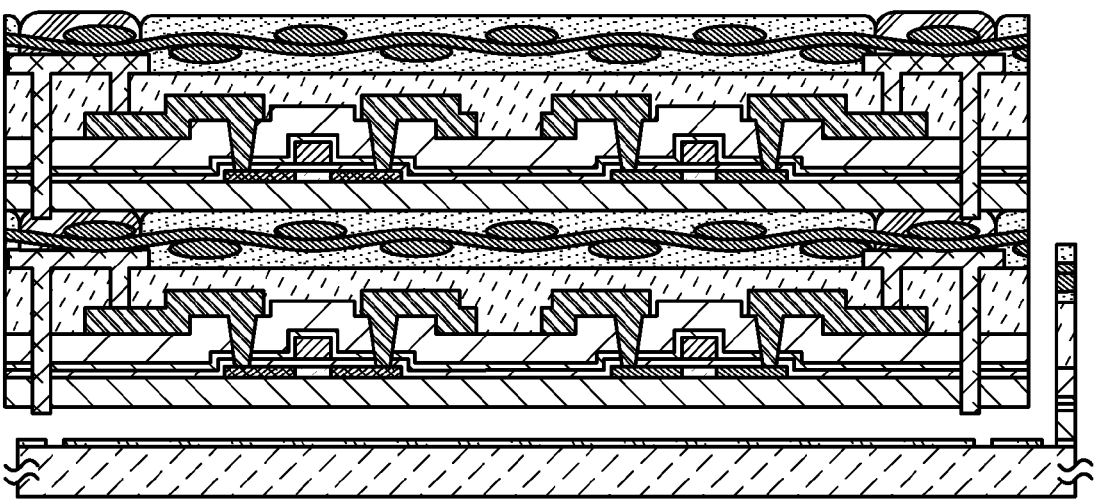
Figure 7C:
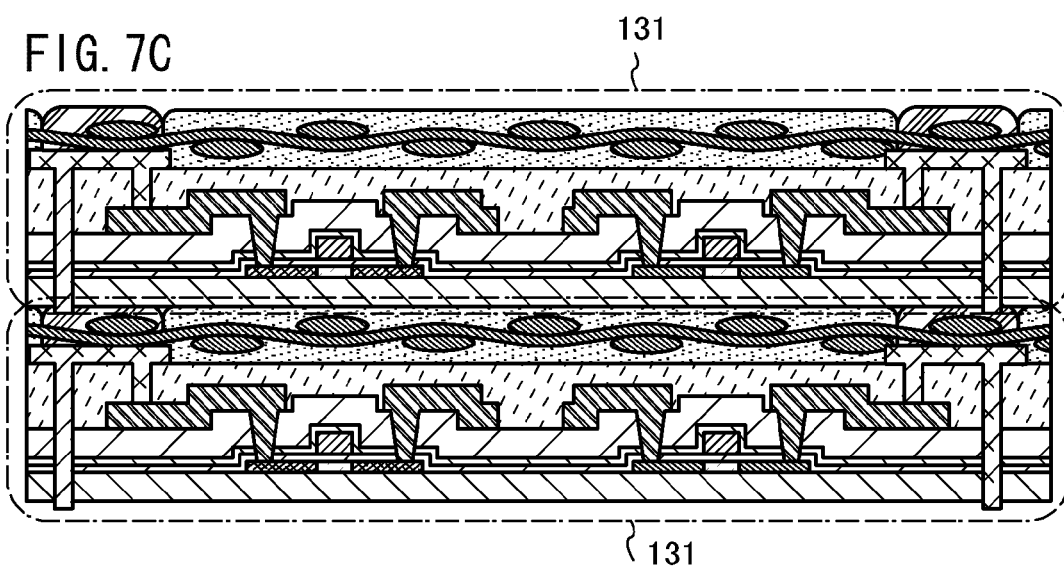

Then, as in the manufacturing step of FIG. 5D, by using the groove 123 as a trigger, a part of the semiconductor element layer 129 and a part of the structural body 120 in the other stacked body 125, and the semiconductor circuit element 171 manufactured previously are separated from the substrate 101 having an insulating surface over which the separation layer 102 is provided, by a physical means along the interface between the separation layer 102 and the insulating film 156 in the other stacked body 125 (see FIG. 7B). As a result, a stacked structure in which the two semiconductor circuit elements 171 are stacked is manufactured (see FIG. 7C). Note that the manufacturing step of FIG. 7B corresponds to the manufacturing step of FIG. 2C, and the stacked structure including the two semiconductor circuit elements 171 illustrated in FIG. 7C corresponds to the stacked structure including the two semiconductor circuit elements 111 illustrated in FIG. 2D.

Through the above steps, the semiconductor circuit in which a plurality of the semiconductor circuit elements 171 is stacked can be manufactured.

This application is based on Japanese Patent Application serial No. 2008-288760 filed with Japan Patent Office on Nov. 11, 2008, the entire contents of which are hereby incorporated by reference.

What is claimed is:

1. A method for manufacturing a semiconductor device, comprising the steps of:
    forming a first separation layer over a first substrate;
    forming a first semiconductor element layer over the first separation layer;
    irradiating the first semiconductor element layer and the first separation layer with a first laser beam, so that a part of the first semiconductor element layer and a part of the first separation layer are removed to form a first opening;
    forming a first wiring in the first opening, the first wiring being electrically connected to the first semiconductor element layer;
    forming a first protective material over the first semiconductor element layer;
    forming a first electrode in the first protective material, the first electrode being electrically connected to the first wiring;
    separating the first semiconductor element layer, over which the first protective material is formed, from the first substrate along the first separation layer;
    forming a second separation layer over a second substrate;
    forming a second semiconductor element layer over the second separation layer;
    irradiating the second semiconductor element layer and the second separation layer with a second laser beam, so that a part of the second semiconductor element layer and a part of the second separation layer are removed to form a second opening;
    forming a second wiring in the second opening, the second wiring being electrically connected to the second semiconductor element layer;
    forming a second protective material over the second semiconductor element layer;
    forming a second electrode in the second protective material, the second electrode being electrically connected to the second wiring;
    bonding the first semiconductor element layer to the second protective material over the second semiconductor element, thereby connecting the first wiring to the second electrode; and
    separating the second semiconductor element layer, over which the second protective material is formed, and the first semiconductor element layer, over which the first protective material is formed, from the second substrate along the second separation layer.

2. The method for manufacturing a semiconductor device, according to claim 1, wherein the first laser beam and the second laser beam are each a laser beam having a wavelength of 10 nm to 400 nm, a laser beam having a wavelength of 400 nm to 700 nm, or a laser beam having a wavelength of 700 nm to 1 mm.

3. The method for manufacturing a semiconductor device, according to claim 1, wherein the first laser beam and the second laser beam are each emitted from any one of an excimer laser, a gas laser, a solid-state laser, and a semiconductor laser.

4. The method for manufacturing a semiconductor device according to claim 1, further comprising the steps of:
    irradiating a part of the first protective material, a part of the first semiconductor element layer and a part of the first separation layer with a third laser beam to form a first groove prior to the separation from the first substrate, and
    irradiating a part of the second protective material, a part of the second semiconductor element layer and a part of the second separation layer with a fourth laser beam to form a second groove prior to the separation from the second substrate.

5. The method for manufacturing a semiconductor device, according to claim 4, wherein the third laser beam and the fourth laser beam are each a laser beam having a wavelength of 10 nm to 400 nm, a laser beam having a wavelength of 400 nm to 700 nm, or a laser beam having a wavelength of 700 nm to 1 mm.

6. The method for manufacturing a semiconductor device, according to claim 4, wherein the third laser beam and the fourth laser beam are each emitted from any one of an excimer laser, a gas laser, a solid-state laser, and a semiconductor laser.

7. The method for manufacturing a semiconductor device according to claim 1, wherein propagations of liquid along the first and the second separation layers contribute to separating the first and the second semiconductor element layers from the first and the second substrates, respectively.

8. The method for manufacturing a semiconductor device according to claim 1, wherein separating the first and the second semiconductor element layers from the first and the second substrates, respectively, is obtained by applying a mechanical force.

9. The method for manufacturing a semiconductor device according to claim 1, wherein separating the first and the second semiconductor element layers from the first and the second substrates, respectively, is obtained by gas etching of the first and the second separation layers, respectively.

10. The method for manufacturing a semiconductor device, according to claim 1, wherein the first electrode and the second electrode are each made of a conductive resin.

11. The method for manufacturing a semiconductor device according to claim 1, wherein the first and the second electrodes are obtained by making a conductive paste react in selected areas with the first and the second protective materials, respectively.

12. The method for manufacturing a semiconductor device according to claim 11, wherein the conductive paste contains at least one of copper (Cu), silver (Ag), nickel (Ni), gold (Au), platinum (Pt), palladium (Pd), tantalum (Ta), molybdenum (Mo), and titanium (Ti).

13. The method for manufacturing a semiconductor device according to claim 1, wherein the first and the second protective materials are structural bodies, each comprising a sheet-like fiber body which is impregnated with an organic resin.

14. The method for manufacturing a semiconductor device according to claim 13, wherein the first and the second electrodes are formed by making conductive particles penetrate the organic resin.

15. The method for manufacturing a semiconductor device according to claim 14, wherein the conductive particles contain at least one of copper (Cu), silver (Ag), nickel (Ni), gold (Au), platinum (Pt), palladium (Pd), tantalum (Ta), molybdenum (Mo), and titanium (Ti).

16. The method for manufacturing a semiconductor device according to claim 13, wherein the sheet-like fiber body includes woven fabrics.

17. The method for manufacturing a semiconductor device according to claim 16, wherein basket holes of the woven fabrics have a side length comprised between 0.01 mm and 0.2 mm.

18. The method for manufacturing a semiconductor device according to claim 1, further comprising the steps of:
irradiating the first and the second semiconductor element layers with a fifth and a sixth laser beams to form a third and a fourth openings by removing some parts of the first and the second semiconductor element layers prior to forming the first and the second wiring, respectively, and
forming a third and a fourth wiring in the third and the fourth openings, respectively, during the same step of forming the first and the second wiring, the third and the fourth wiring being connected to the first and the second wiring, respectively.

19. The method for manufacturing a semiconductor device, according to claim 18, wherein the fifth laser beam and the sixth laser beam are each a laser beam having a wavelength of 10 nm to 400 nm, a laser beam having a wavelength of 400 nm to 700 nm, or a laser beam having a wavelength of 700 nm to 1 mm.

20. The method for manufacturing a semiconductor device, according to claim 18, wherein the fifth laser beam and the sixth laser beam are each emitted from any one of an excimer laser, a gas laser, a solid-state laser, and a semiconductor laser.

21. The method for manufacturing a semiconductor device according to claim 13, wherein the first and the second electrodes are obtained without damaging the sheet-like fiber body.

\* \* \* \* \*